United States Patent [19]
Hidese

[11] Patent Number: 5,113,581
[45] Date of Patent: May 19, 1992

[54] OUTER LEAD BONDING HEAD AND METHOD OF BONDING OUTER LEAD

[75] Inventor: Wataru Hidese, Chikushino, Japan

[73] Assignee: Matsushita Electric Industrial Co., Ltd., Osaka, Japan

[21] Appl. No.: 626,060

[22] Filed: Dec. 13, 1990

[30] Foreign Application Priority Data

Dec. 19, 1989 [JP] Japan .................. 1-330755
Dec. 19, 1989 [JP] Japan .................. 1-330756

[51] Int. Cl.⁵ .......................... H05K 3/30; H05K 3/34
[52] U.S. Cl. .......................... 29/840; 29/740; 29/741; 29/743; 228/6.2; 228/180.2
[58] Field of Search ........... 29/743, 740, 741, 840; 228/5.5, 6.2, 180.2, 222

[56] References Cited

U.S. PATENT DOCUMENTS

| | | | |
|---|---|---|---|
| 3,883,945 | 5/1975 | Wallis ................. | 228/180.2 |
| 4,300,715 | 11/1981 | Keizer et al. ......... | 228/180.2 |
| 4,787,548 | 11/1988 | Abbagnaro et al. ... | 228/6.2 |
| 4,979,664 | 12/1990 | Lyons et al. .......... | 228/180.2 |

Primary Examiner—P. W. Echols
Attorney, Agent, or Firm—Lowe, Price, LeBlanc & Becker

[57] ABSTRACT

A nozzle shaft is moved down, and a semiconductor chip sucked to the lower end of the nozzle shaft is placed on a circuit board. Then, a thermally press-bonding member is moved down, and the outer leads of the semiconductor chip are pressed to the circuit board by the thermally press-bonding member. Thereafter, the thermally press-bonded member is pressed by pressing means to strongly press the outer leads to the circuit board, the thermally press-bonding member is then raised to release the pressing state, and the outer leads are thermally press-bonded to the circuit board.

7 Claims, 9 Drawing Sheets

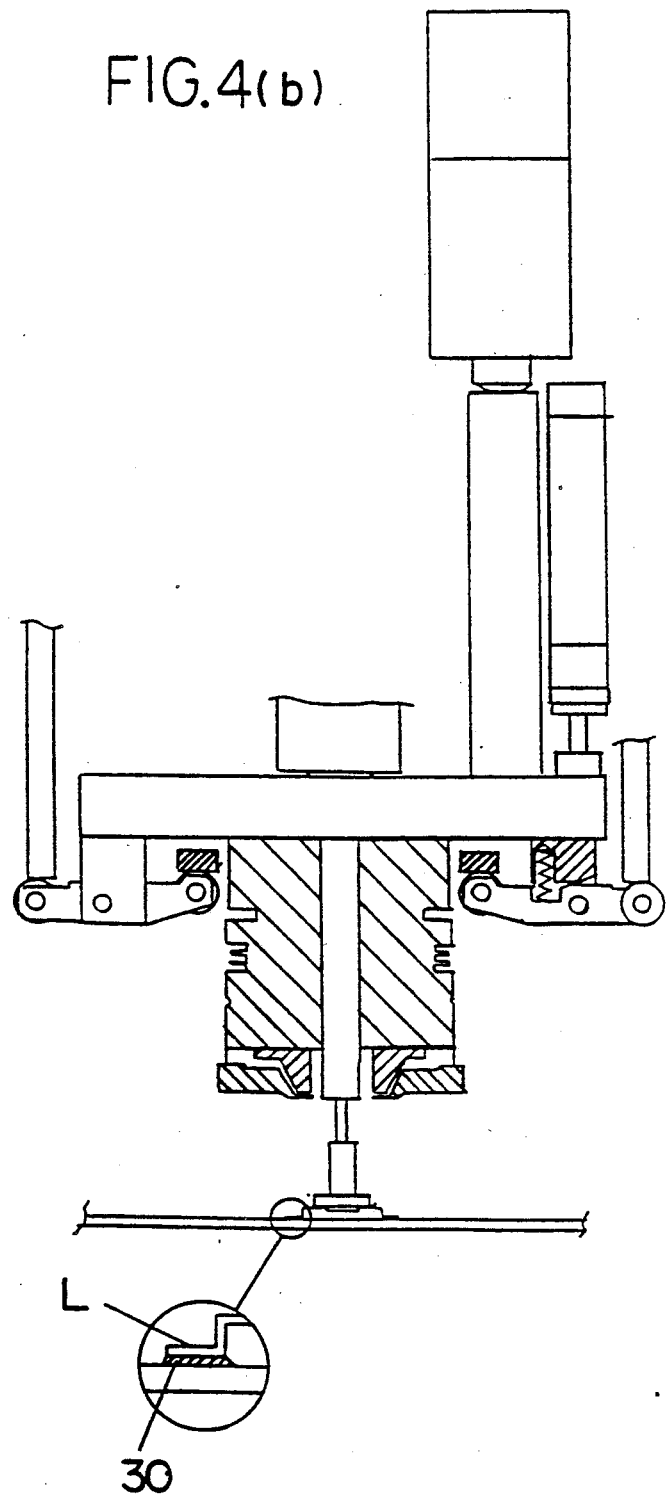

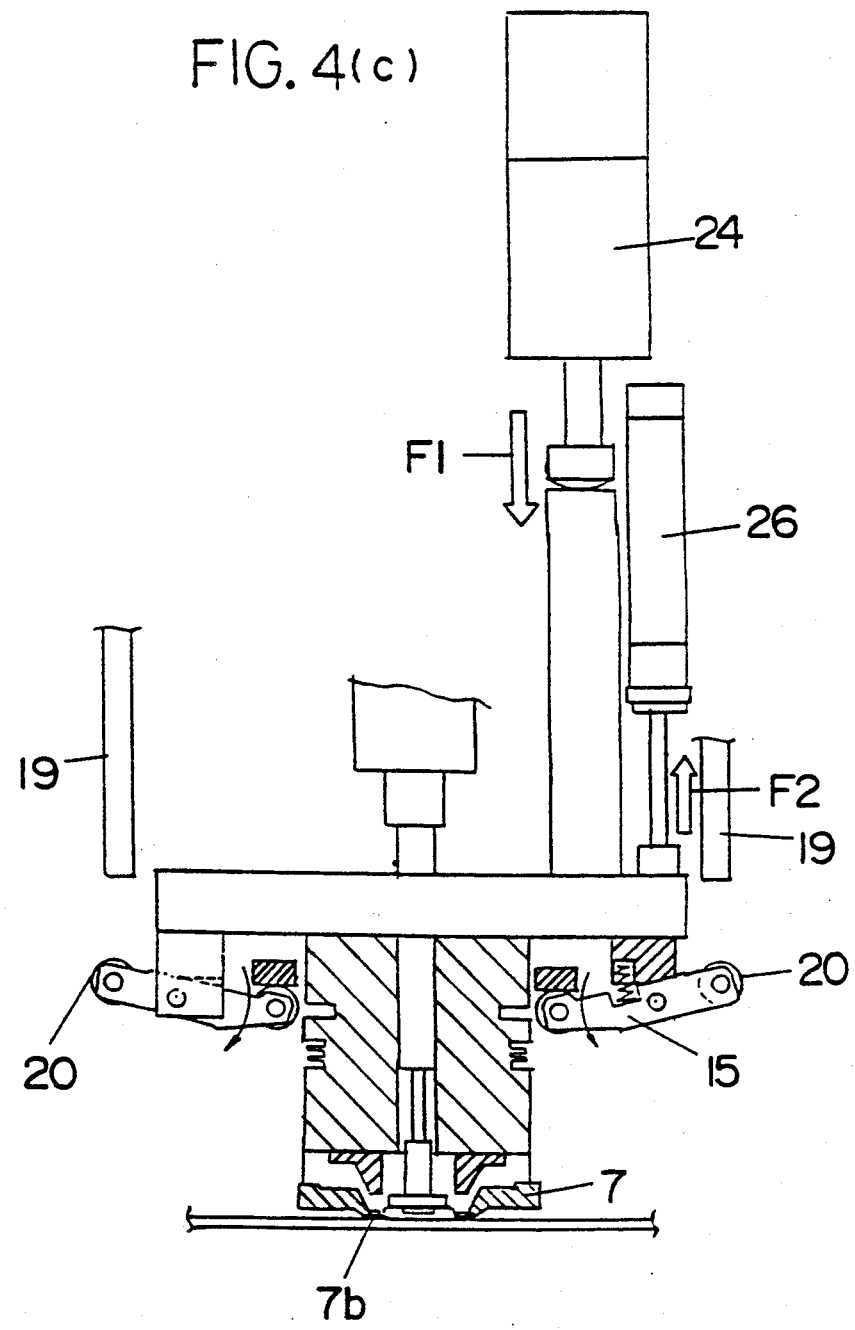

OUTER LEAD BONDING HEAD AND METHOD OF BONDING OUTER LEAD

BACKGROUND OF THE INVENTION

1. Field of the Invention

This invention relates to an outer lead bonding head and a bonding method thereof and, more particularly, to means for thermally press-bonding outer leads of semiconductor chips manufactured by a TAB (Tape Automated Bonding) method on a circuit board.

2. Description of the Prior Art

The TAB method is known to manufacture semiconductor chips by mounting the semiconductors on a film carrier made of a synthetic resin film and punching the film carrier.

The semiconductor chip manufactured as described above has outer leads formed by punching the film carrier as above, and it is generally called "an outer lead bonding" to bond the outer leads to electrodes formed on a circuit board.

Since the outer lead is extrafine, narrow at its pitch, and formed of extremely thin synthetic resin, the body of the lead is very weak, and it is remarkably difficult to accurately bring and bond the outer lead to the extrafine electrode formed on the circuit board.

A solder to be the material of the electrodes has melting and solidifying temperature characteristics, though depending upon sorts of the solders. It is generally desirable to gradually heat the solder up to 160° to 180° C., to then rapidly heat it to 220° C. or higher to melt it, to then gradually cool it to solidify it. Since the outer lead is extrafine and extremely thin and formed of the synthetic resin such as polyimide, its quality is changed if it is rapidly heated to a high temperature not to be preferable and hence it should be gradually heated. As described above, since the bonding conditions of the outer lead are extremely severe, outer lead bonding technique is not yet established at present.

SUMMARY OF THE INVENTION

It is an object of this invention to provide a bonding means which can accurately bond extrafine and extremely thin outer leads manufactured by the TAB method accurately to a circuit board.

In order to achieve this and other objects according to the present invention, there is provided a bonding head of an outer lead comprising a vertically movable nozzle shaft having a sucking unit for a semiconductor or chip semiconductor at a lower end thereof, a thermally press-bonding member vertically movably provided at the side of the sucking unit but independently of the sucking unit, heating means for heating the thermally press-bonding member, and pressing means for pressing the thermally press-bonding member to the outer leads, thereby to thermally press the outer leads of the semiconductor placed on a circuit board by said sucking unit.

With the arrangement described above, the semiconductor chip sucked to the sucking unit is placed on the circuit board, and the thermally press-bonding member which has been heated is pressed to the outer leads of the semiconductor chip, and if the pressing state is then released, the outer leads are bonded to the circuit board.

These and other objects and features of the present invention will become apparent from the following detailed description in conjunction with the attached drawings.

BRIEF DESCRIPTION OF DRAWINGS

FIG. 4(a), 4(b), 4(c), 4(d), 4(e) and 4(f) are front views of operating sequence.

DESCRIPTION OF THE PREFERRED EMBODIMENTS

An embodiment of the present invention will now be described with reference to the accompanying drawings.

Figure 1:
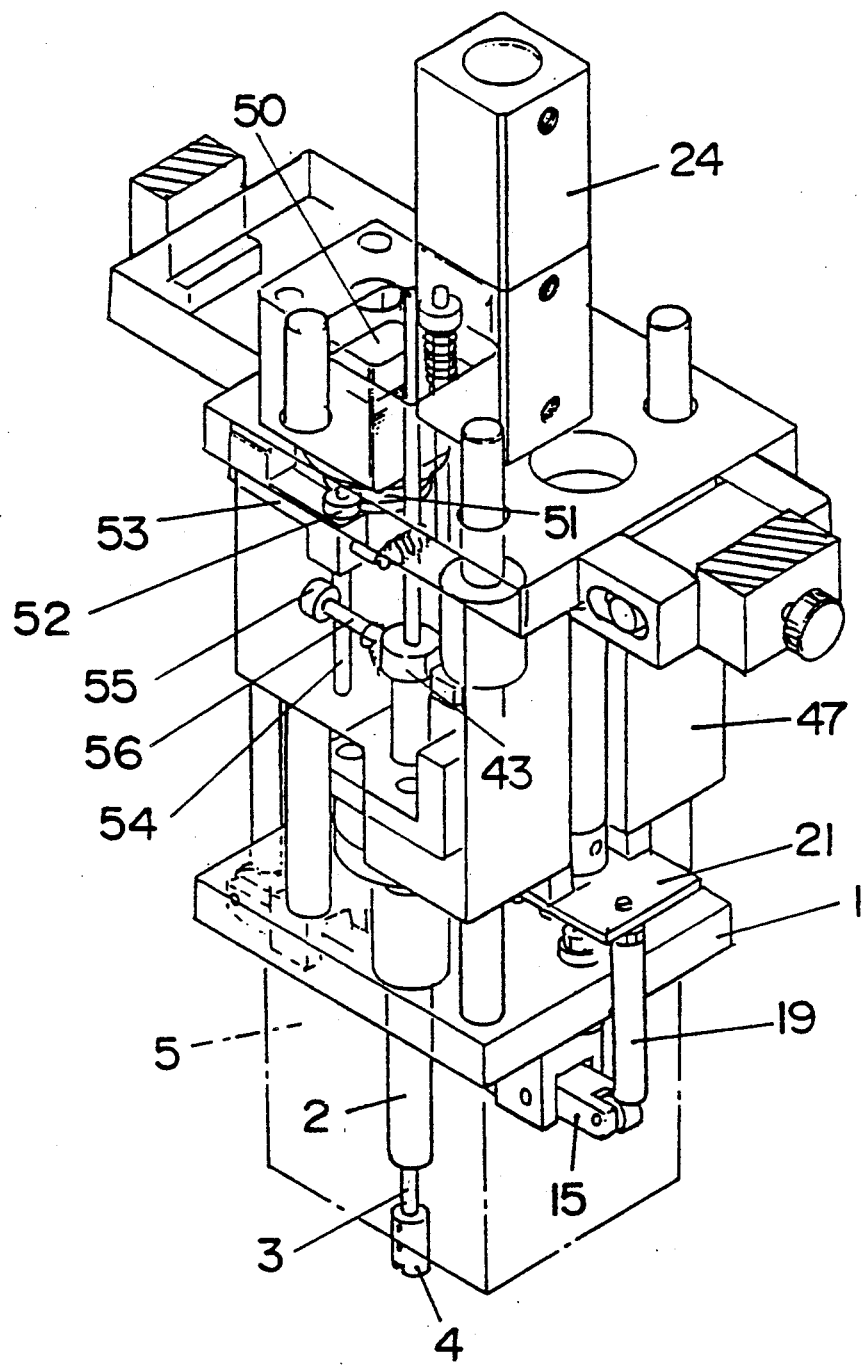
FIG. 1 is a perspective view of an embodiment of a bonding head according to the present invention.
Figure 2:
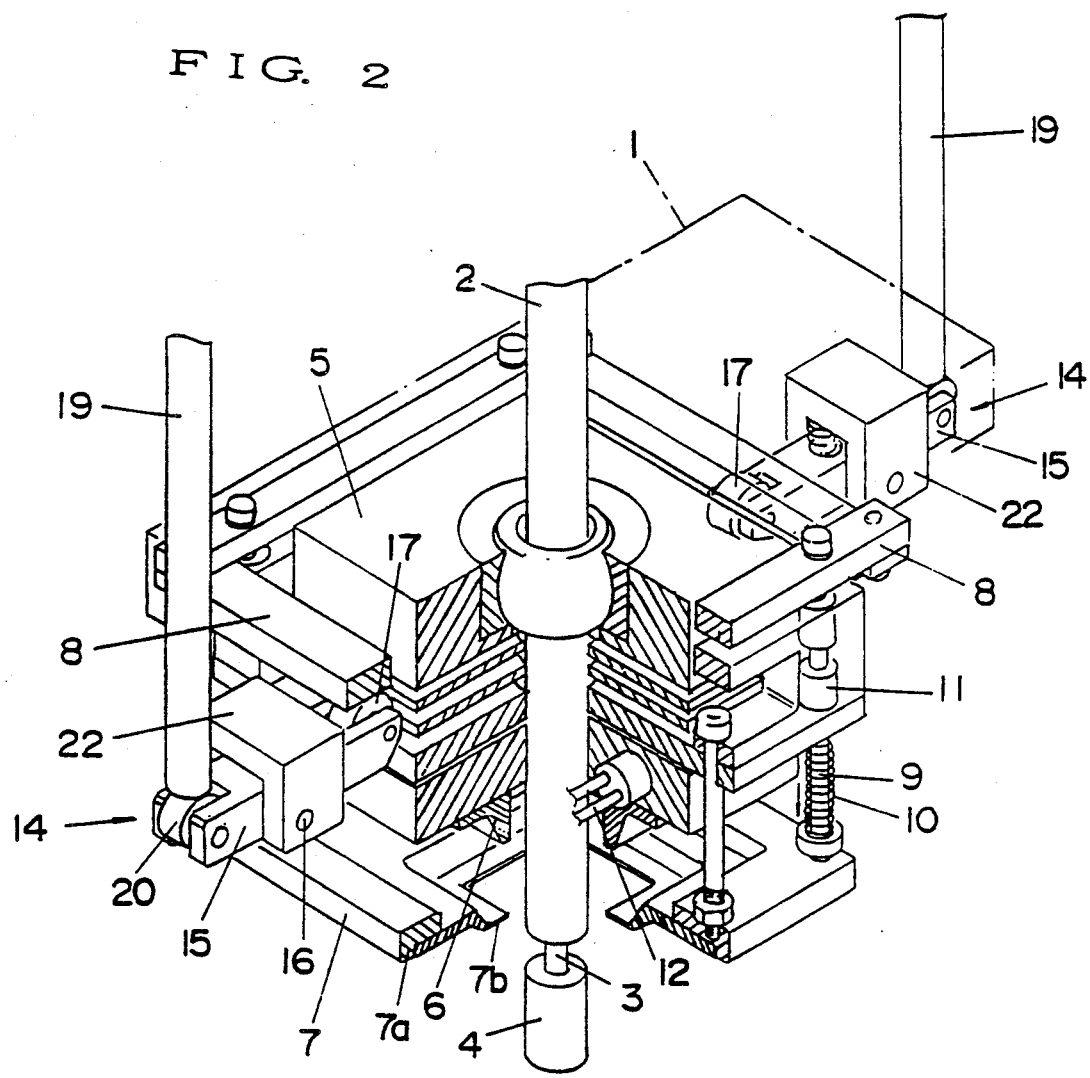
FIG. 2 is a perspective view, partly in section, of the bonding head.
Figure 3:
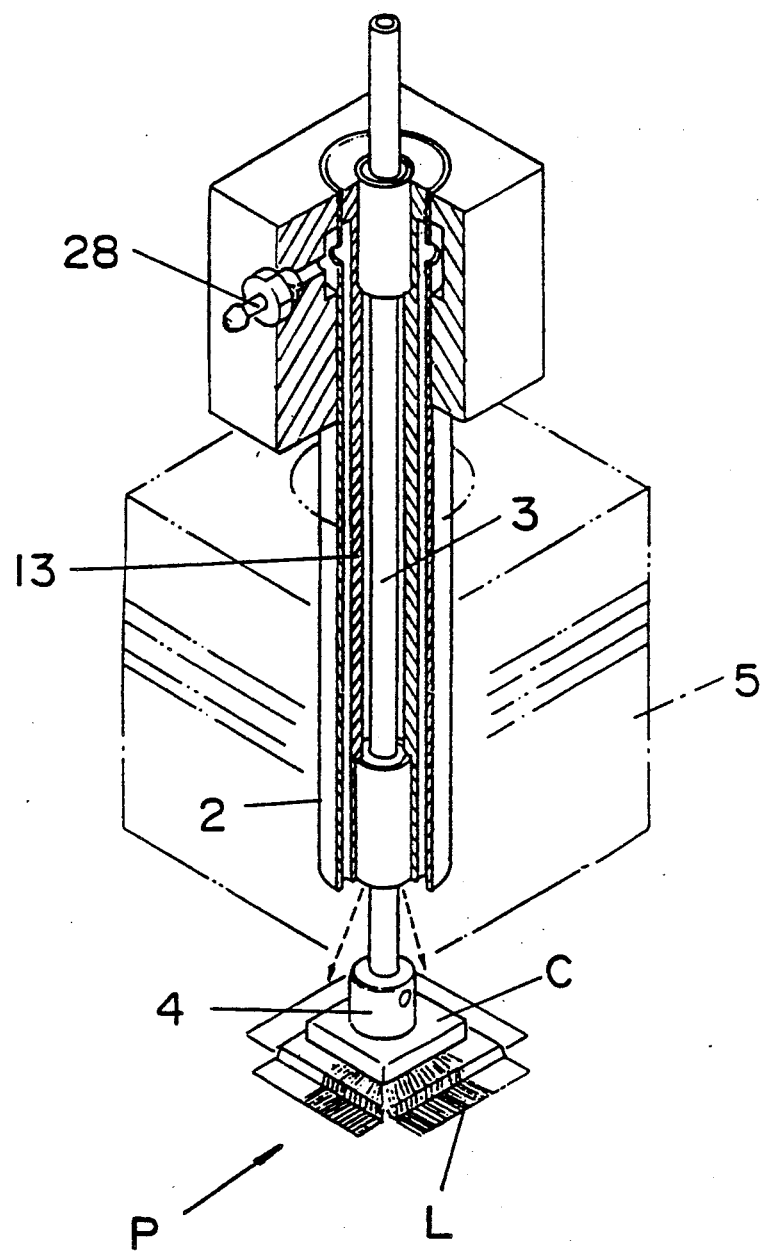
FIG. 3 is a sectional view of a cooling means.

FIG. 1 is the perspective view of the bonding head of the present invention, and FIG. 2 is a perspective view partly cut out of the bonding head. An erecting tube 2 is mounted at the center of a plate-shaped supporting frame 1. A nozzle shaft 3 is vertically movably inserted into the tube 2, and a sucking unit 4 for sucking a semiconductor chip P is provided at the lower end of the nozzle shaft 3. The semiconductor chip P is manufactured by the TAB method. As shown in FIG. 3, extrafine and extremely thin outer leads L which are formed by punching a film carrier extend from the four sides of the semiconductor C in four directions. The outer leads L extend from two sides of the semiconductor C in two directions in some cases, and the means of the present invention can also be applied to such a semiconductor chip.

A heat block 5 is provided as a heating means on the lower surface of the supporting frame 1. The erecting tube 2 passes through the heat block 5. In FIG. 2, electric wires 12 are provided. A heat transfer 6 which becomes narrower toward its end integrally protrudes from the lower surface of the heat block 5. A thermal press-bonding member 7 is provided at the side of the sucking unit 4 in a rectangular frame shape surrounding the sucking unit 4 to be brought into press contact with the outer leads L extending in the four directions, and has in its sectional shape a large portion 7a and a small-sized pressing portion 7b. As will be described in detail, the pressing portion 7b is pressed to the outer leads L to be thermally press-bonded to electrodes made of the solder formed on the circuit board. The large portion 7a is a heat accumulator. The thermal press-bonding member 7 may be formed integrally with the heat block 5. In this embodiment, the press-bonding member 7 is separately formed from the heat block 5 so that only the press-bonding member 7 can be replaced for changing the sort of the semiconductor chip. In this case, when outer leads L extend in the two directions, the press-bonding member may not be necessarily formed in the rectangular frame shape, but formed in shape corresponding to the outer leads L of the two directions.

In FIG. 2, a frame-shaped bracket 8 is arranged to surround the heat block 5, and the press-bonding member 7 is coupled to the bracket 8 through a shaft 9. A coil spring 10 biases the press-bonding member 7 downward, and a bearing 11 guides the shaft 9 up or down.

Figure 4A:
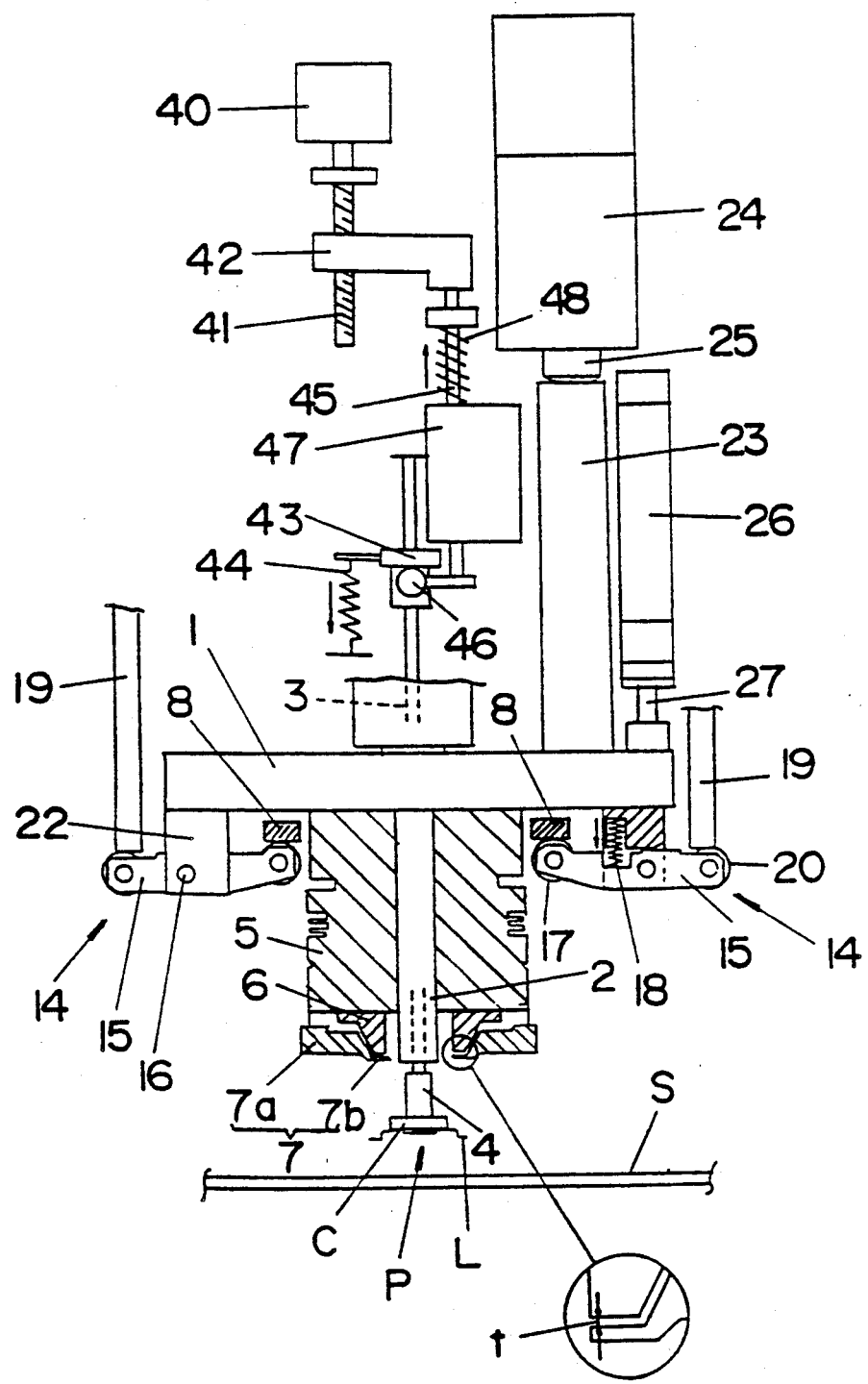

In FIGS. 2 and 4(a), a contacting-and-separating means 14 moves the press-bonding member 7 upward or downward to contact to or separate from the heat transfer 6, and has an arm 15 mounted rotatably around a pin 16 on the mounting plate 22 of the lower surface of the supporting frame 1. The arm 15 is provided at its front portion with a roller 17 contacting the lower surface of the bracket 8. A spring 18 biases the roller 17 downward, i.e., in a direction for separating the press-bonding member 7 from the heat transfer 6 downward. A rod 19 is suspended from a frame 21 (FIG. 1), and pressed at its lower end at a roller 20 supported to the other end of the arm 15 to push the roller 17 to the lower surface of the bracket 8 against the spring force of the spring 18. As will be described in detail, the press-bonding member 7 is brought into contact with or separated from the heat transfer 6 so as to make or break the heat transferring from the heat transfer 6 to the press-bonding member 7, thereby controlling the temperature of the press-bonding member 7. Under the connecting condition where the press-bonding member 7 moves up, the small interval t is secured between the heat transfer 6 and the press-bonding member (see the enlarged part in FIG. 4(a)), whereby the press-bonding member 7 is prevented from overheating by the heat transfer.

In FIG. 4(a), a shaft 23 stands on the upper surface of the supporting frame 1. A multi-stage cylinder 24 is provided on the shaft 23, and a rod 25 is contacted with the upper surface of the shaft 23. The rod 27 of a second cylinder 26 is coupled to the upper surface of the supporting frame 1. The second cylinder 26 supports the loads of the supporting frame 1 and the heat block 5, etc. by its retracting force F2 FIG. 4(c)) The cylinder 24 is a pressing means for strongly pressing the press-bonding member 7 to the outer leads L and serves as an elevation means for vertically moving the press-bonding member 7 independently of the sucking unit 4.

In FIG. 4(a), a pulse motor 40 moves up or down the nozzle shaft 3 to rotate a threaded lever 41 to move up or down a nut 42 engaged with the threaded lever 41. A block 43 is mounted on the upper end of the nozzle shaft 3, and the nozzle shaft 3 is biased downward by a coil spring 44. A shaft 45 is pressed at its upper end to the nut 42, and a roller 46 is mounted on the lower end for pressing the lower surface of the block 43. An elevation guide block 47 of the shaft 45, and a coil spring 48 for biasing upward the shaft 45 are provided. In the drawings, the biasing directions of the springs are denoted by arrows.

When the pulse motor 40 is operated to move the nut 42 down, the shaft 45 moves down against the elastic force of the coil spring 48 to move the roller 46 downward, and the nozzle shaft 3 is moved down by the elastic force of the coil spring 44. When the nut 42 is moved up, the shaft 45 is raised by the elastic force of the coil spring 48, and the nozzle shaft 3 is lifted by the roller 46.

In FIG. 1, a motor 50 rotates the nozzle shaft 3 around its axis. There is provided a cam 51, a cam follower 52, a rotor 53 mounted with the cam follower 52, and a shaft 54 suspended from the rotor 53. A roller 55 is mounted at the end of the rod 56 extending from the nozzle shaft 3 for pressing the shaft 54. These means horizontally rotate the semiconductor chip P sucked to the sucking unit 4 to correct the direction and position in the direction θ, but do not directly relate to the present invention, and the detailed description thereof will be omitted.

FIG. 3 shows cooling means. An inner tube 13 is inserted between the nozzle shaft 3 and the erecting tube 2. A chilled gas is fed between the erecting tube 2 and the inner tube 13 through a pipe 28 to be arbitrarily blown from the lower end of the tube 2 toward the pressing portion 7b of the press-bonding member 7 for pressing the outer leads L (arrows with dotted lines). The pipe 28 is connected to the upper part of the erecting tube 2, and the blown chilled gas is moved down between the tube 2 and the inner tube 13. Accordingly, the chilled gas cools the nozzle shaft 3 over the entire length. Thus, the nozzle shaft 3 is prevented from being excessively heated and thermally deformed by the heat block 5 to prevent an error from occurring in the bonding. The temperature of the chilled gas is, for example, at the ambient temperature. A space is also provided between the nozzle shaft 3 and the inner tube 13 thereby interrupting the heat of the heat block 5 to be transferred to the nozzle shaft 3. When chilled gas is blown from the lower end of the tube 2 inserted with the nozzle shaft 3, it goes in the four directions to uniformly apply to the pressing portion 7b disposed to surround the sucking unit 4. A chilled gas blowing means may be separately provided from the tube 2 and the heat block 5 to blow the chilled gas from obliquely above the press-bonding member 7 toward the pressing portion 7b of the press-bonding member 7. The structure of the cooling means is not limited to the particular embodiment.

This bonding head is composed as described above, and a method of bonding outer leads will be described with reference to FIGS. 4(a) to 4(f).

The bonding head for sucking the semiconductor chip P at the lower end of the sucking unit 4 is moved above the board S (FIG. 4(a)) Then, the motor 40 is driven to move down the sucking unit 4, the semiconductor chip P is placed on the board S, and the outer leads L are landed on electrodes 30 made of the solder formed on the upper surface of the board S (FIG. 4(b)).

Then, the cylinder 24 is operated to move down the supporting frame 1. The roller 20 is then separated from the rod 19, the arm 15 is rotated by the elastic force of the spring 18 to allow the press-bonding member 7 to move down and to press the pressing portion 7b to the outer leads L to thereby press the leads to the electrodes 30 (FIG. 4(c)). In this case, if the pressing portion 7b is abruptly pressed to the outer leads L by a strong force, the outer leads L and the electrodes 30 are readily adversely affected. Then, the cylinder first protrudes the rod 25 of the multi-stage cylinder 24 with a weak force to move down the press-bonding member 7, which rotates the arm 15 with the elastic force of the spring 18 to permit a first pressing of the pressing portion 7b to the outer leads L with a weak force (FIG. 4(c)) Thereafter, when the heat transfer 6 lands on the press-bonding member 7, the protruding force F1 of the rod 25 of the multi-stage cylinder 24 is increased to press the pressing portion 7b to the outer leads L strongly (FIG. 4(d)).

Figure 4D:
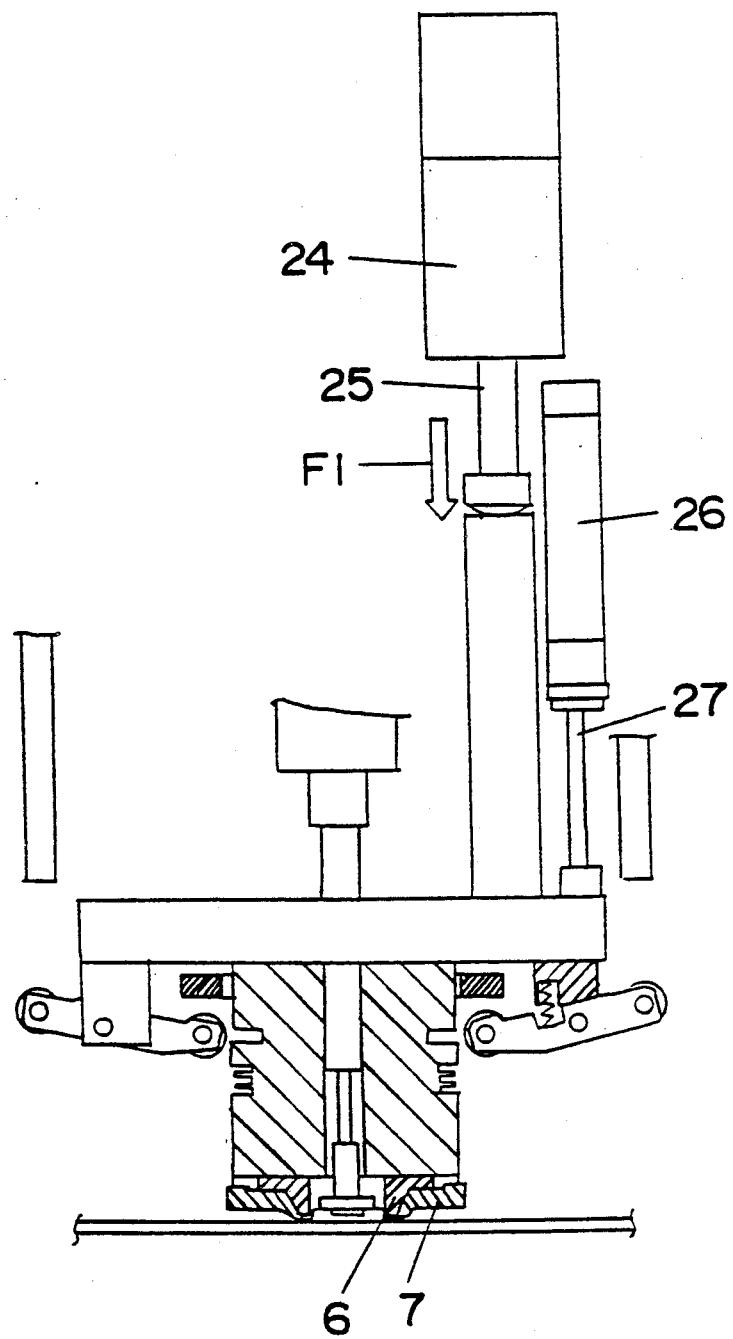
Figure 4E:
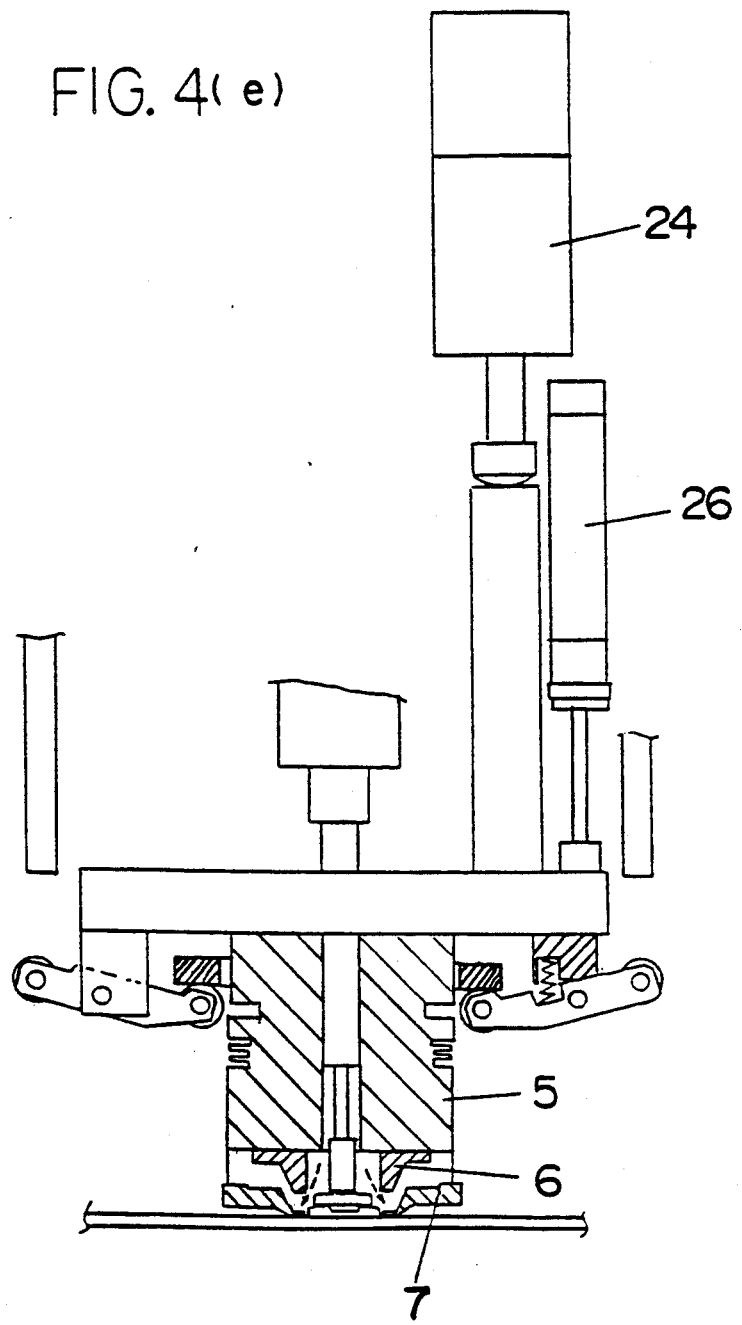

Then, the rod 25 of the cylinder 24 is retracted upward to raise the heat block 5 (FIG. 4(e)) The press-bonding member 7 is separated from the heat transfer 6 in this state, and the pressing state of the outer leads L is maintained by the elastic force of the spring 18. Thereafter, the rod 27 is raised to separate the press-bonding member 7 from the outer leads L, and the bonding work is finished (FIG. 4(f)).

The solder serving as the electrodes 30 has the following melting and solidifying temperature characteristics. The solder is desirably melted by heating it up to 160° to 180° C., then rapidly heating it to 220° C. or higher to melt it, and then gradually cooling it to solidify it. Therefore, in the apparatus, the heating temperature of the electrodes 30 is controlled as below.

The temperature of the heat block 5 is always constant at 200°–230° C., but the press-bonding member 7 is preheated to approx. 160°–180° C. because of the small interval t and the heat transfer 6. Then, as shown in FIG. 4(c), the press-bonding member 7 is moved down and lands on the outer leads L to gradually heat the electrodes 30 while pressing the outer leads L.

Subsequently, as shown in FIG. 4(d), the heat transfer 6 lands on the press-bonding member 7 and the temperature of the press-bonding member 7 is rapidly raised to 220°–230° C. to completely thermally melt the electrodes 30. Under such a condition the outer leads L are forcibly pressed to the electrodes 30 by the protruding force F1 of the rod 25 of the cylinder 24, thereby to thermally press-bond the outer leads L to the electrodes 30.

Figure 4F:
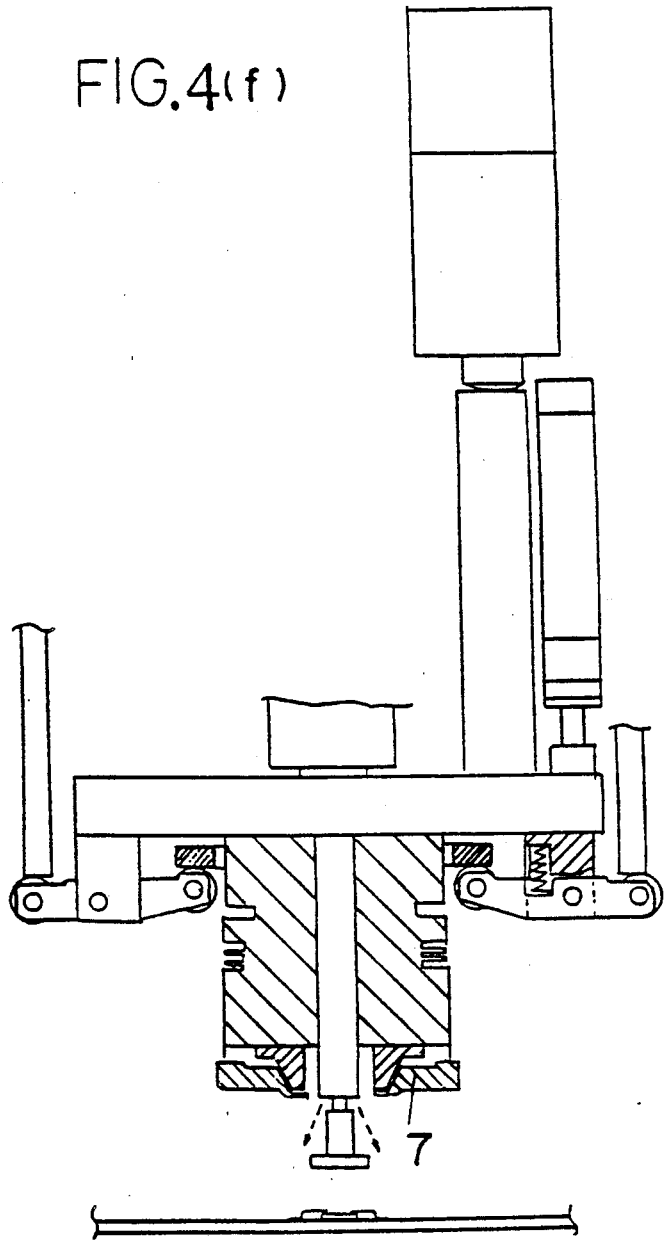

Then, as shown in FIG. 4(e), the heat transfer 6 is raised and separated from the press-bonding member 7 to interrupt the heat transfer to the press-bonding member 7. The chilled gas is blown as indicated by the dotted arrows to cool the press-bonding member 7 and the electrodes 30 to 180° C. or lower and to maintain the pressing state by the press-bonding member 7. If the electrode 30 is heated to 220° C. or higher and the press bonding member 7 is then rapidly moved up together with the heat transfer 6 to cancel or release the pressure on the outer leads L, the outer leads L will spring back from the electrode 30 which is still molten. Therefore, as described above, the pressure on the center leads L is still maintained after the heat transfer 6 has been moved up, and the electrodes 30 are cooled to about 180° C., and when there is no danger of said spring-back, the press-bonding member 7 should be moved up to cancel the pressure on the outer leads. As shown in FIG. 4(f), when the pressed state of the press-bonding member 7 is released, the blowing of the chilled gas is stopped, the electrodes 30 are gradually cooled to solidification, and the outer leads L are fixed to the electrodes 30.

As described above, the means of the invention is provided with the press-bonding member 7 separately movable with respect to the heat block 5 of the heating means, provided with means for blowing the chilled gas toward the pressing portion 7b and the electrodes 30. Therefore, the electrodes 30 can be preferably heated to be melted, and the outer leads L can be accurately bonded to the electrodes 30. Said temperatures as 180° or 220° C. are merely exemplified, and the temperature depends upon the sort of the solder.

According to the present invention as described above, the outer leads can be accurately bonded to the electrodes of the board by the thermally press-bonding member. The press-bonding member is separably contacted to the heating means, thereby enabling to control the heating temperature of the electrodes for preferably thermally melting the electrodes. Since the temperature of the press-bonding member may be also controlled by the cooling means, the press-bonding member of relatively low temperature is first pressed to the outer leads, and the temperature of the press-bonding member is then raised to heat the outer leads and the electrodes to high temperature, whereby the outer leads are scarcely changed in quality, while satisfying the temperature characteristics of the electrodes to preferably thermally press-bond the outer leads to the electrodes.

What is claimed is:

1. An outer lead bonding head comprising a vertically movable nozzle shaft having a suction unit to hold a semiconductor or chip semiconductor at a lower end thereof, a thermally press-bonding member provided independently of the suction unit at the side of the suction unit, heating means for heating the thermally press-bonding member, means to vertically move said thermally press-bonding member independent of said heating means and said suction unit for providing a space between said heating means and said thermal press-bonding member for control of heating said thermal press-bonding member and pressing means for pressing the thermally press-bonding member to outer leads of the semiconductor placed on a circuit board by said suction unit.

2. An outer lead bonding head according to claim 1, wherein said heating means has a heat transfer member for contacting said thermally press-bonding member to heat said thermally press-bonding member through the heat transfer member.

3. An outer lead bonding head comprising a nozzle shaft having a suction unit to hold a semiconductor or chip semiconductor at a lower end thereof, heating means, and a thermally press-bonding member separate from said heating means at the lower portion of said heating means and movable with respect to said heating means for control of heating of said thermal press-bonding member, said thermal press-bonding member for thermally press-bonding to the circuit board outer leads of the semiconductor or chip placed on a circuit board by said suction unit.

4. A method of bonding outer leads comprising the steps of moving down a nozzle shaft, placing a semiconductor chip suctioned to the lower end of said nozzle shaft on a circuit board, preheating a thermally press-bonding member, then moving down the thermally press-bonding member, pressing the outer leads of the semiconductor chip to the circuit board, using a weak force then further pressing the thermally press-bonding member using a stronger force to strongly press the outer leads to the circuit board, then moving up the thermally press-bonding member to release the pressing state, thereby providing thermally press-bonding of the outer leads to the circuit board.

5. An outer lead bonding head comprising a vertically movable nozzle shaft having a suction unit to hold a semiconductor or chip semiconductor at a lower end thereof, a thermally press-bonding member disposed at the side of said suction unit for thermally press-bonding outer leads placed on a circuit board by said suction unit to the circuit board, and cooling means for blowing chilled gas to the thermally press-bonding member.

6. An outer lead bonding head according to claim 5, wherein an erecting tube for containing said nozzle shaft and a pipe for feeding chilled gas to said erecting tube are provided, and chilled gas is blown from the lower end of said erecting tube downward.

7. A method of bonding outer leads, comprising the steps of moving down a nozzle shaft, placing the outer leads of a semiconductor chip suctioned to a suction portion at the lower end of said nozzle shaft onto electrodes of a circuit board, then moving down a thermally press-bonding member heated by a heating means, pressing said press-bonding member onto the outer leads, thereby to melt said electrodes, subsequently blowing a chilled gas to said press-bonding member to cool the press-bonding member and the electrodes, and raising the press-bonding member to release the pressure, thereby providing thermally press-bonding of the outer leads onto the electrodes formed on the circuit board.

* * * * *